US008546833B2

(12) United States Patent
Chang et al.

(10) Patent No.: US 8,546,833 B2
(45) Date of Patent: Oct. 1, 2013

(54) LED PACKAGE AND LIGHT EMITTING DEVICE HAVING THE SAME

(75) Inventors: Chao-Hsiung Chang, Hsinchu (TW); Hou-Te Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/585,847

(22) Filed: Aug. 15, 2012

(65) Prior Publication Data

US 2013/0134463 A1 May 30, 2013

(30) Foreign Application Priority Data

Nov. 30, 2011 (CN) .......................... 2011 1 0389284

(51) Int. Cl.
*H01L 33/00* (2010.01)

(52) U.S. Cl.
USPC ...................... 257/98; 257/100; 257/E33.059

(58) Field of Classification Search
USPC ..................... 257/98–100, E33.059, E33.072; 438/26, 29
See application file for complete search history.

(56) References Cited

U.S. PATENT DOCUMENTS

| 6,835,960 B2 * | 12/2004 | Lin et al. .......................... 257/81 |
| 7,521,728 B2 * | 4/2009 | Andrews ....................... 257/100 |
| 7,942,550 B2 * | 5/2011 | Inoue et al. .............. 362/249.02 |
| 8,471,287 B2 * | 6/2013 | Hu et al. .......................... 257/98 |
| 2010/0193825 A1 * | 8/2010 | Yang ............................... 257/99 |

* cited by examiner

*Primary Examiner* — Tuan N. Quach
(74) *Attorney, Agent, or Firm* — Altis & Wispro Law Group, Inc.

(57) ABSTRACT

An exemplary LED package includes first and second electrodes, an LED die and an encapsulation. An inner wall of each first and second electrode includes a first oblique plane. The LED die is surrounded by and electrically connected to the first and second electrodes. The LED die includes an outputting surface. The encapsulation is filled between the first electrode ant the second electrode and covers the LED die, and includes opposite first and second outer surfaces, wherein the second outer surface acts as an outputting surface of the LED package. A reflective layer is coated on the first outer surface of the encapsulation. The first oblique plane of the electrode structure is light reflective and extends aslant from the outputting surface of the LED die towards the outputting surface of the LED package along a direction away from the LED die.

15 Claims, 4 Drawing Sheets

LED PACKAGE AND LIGHT EMITTING DEVICE HAVING THE SAME

BACKGROUND

1. Technical Field

The present disclosure generally relates to light emitting devices, and particularly to a light emitting diode (LED) package and a light emitting device equipped with the LED package.

2. Description of Related Art

LEDs are solid state light emitting devices made of semiconductor materials, which are more stable and reliable than other conventional light sources such as incandescent bulbs. Thus, LEDs are being widely used in various fields such as numeral/character displaying elements, signal lights, light sources for lighting and display devices. In use, an LED package is usually provided to obtain protection, color selection, focusing and the like for light emitted by the LEDs.

The LED package generally includes a substrate, a pair of electrodes formed on the substrate, an LED die arranged on the substrate and electrically connected to the electrodes. However, the LED die has a light output angle only at a range of 120 degree, which undesirably results to a small illumination area. To obtain a larger illumination area, a plurality of LED dies is usually provided in predetermined angles to emit light toward different directions.

However, due to that there are usually at least two LED dies arranged in predetermined angles in an LED emitting device, a structure of the LED emitting device is complex, and an installation position of the LED dies are limited.

Therefore, it is necessary to provide an LED package and an LED emitting device equipped with the LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
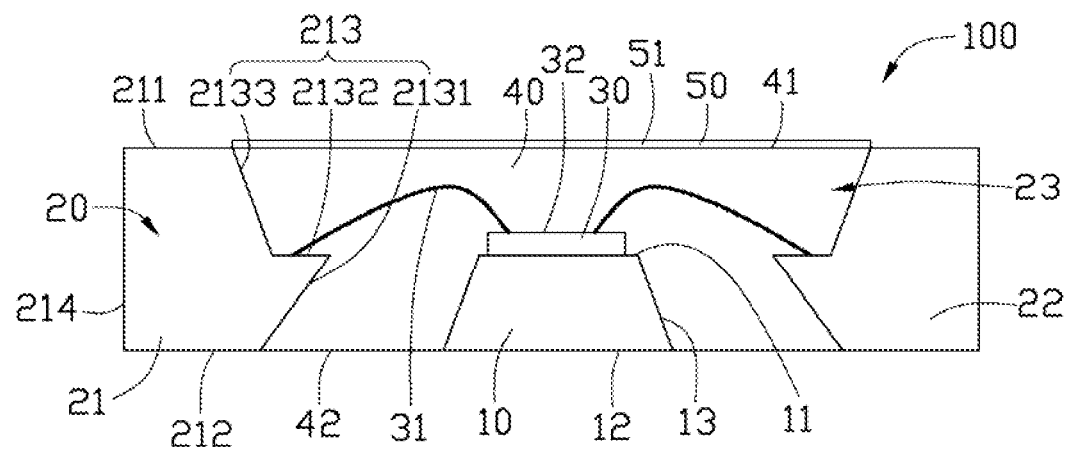
FIG. 1 is a schematic, cross-sectional view of an LED package in accordance with an embodiment of the present disclosure.
Figure 2:
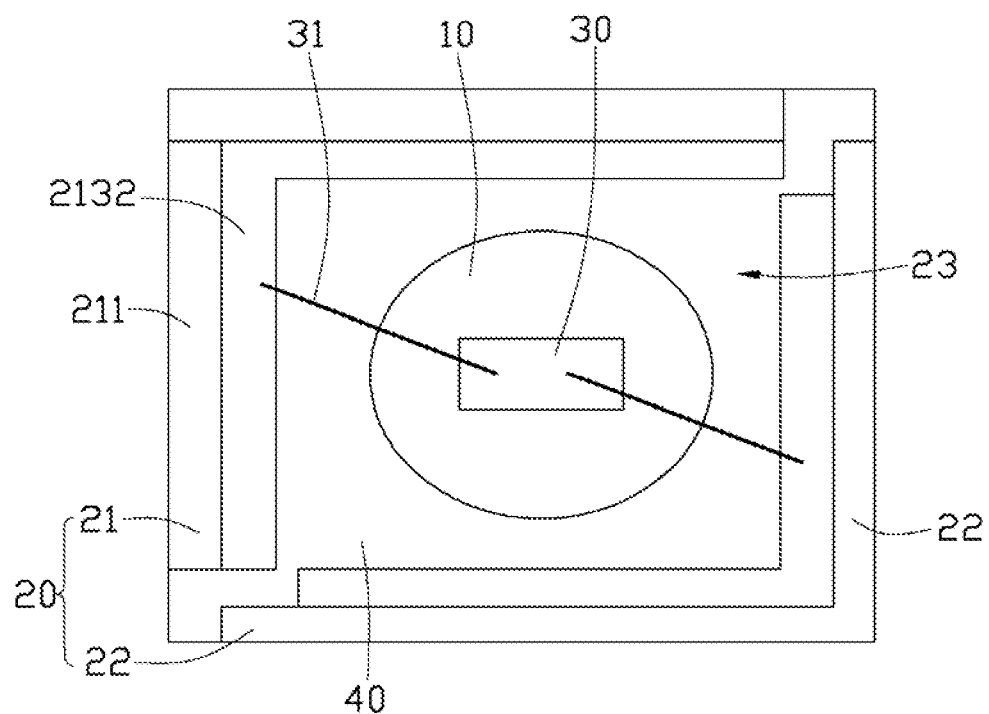
FIG. 2 is a schematic, top view of the LED package of FIG. 1, wherein a reflective layer of the LED package is omitted for illustration.

Referring to FIG. 1, an LED package 100 in accordance with an embodiment of the present disclosure includes a supporting portion 10, an electrode structure 20, an LED die 30, an encapsulation 40, and a reflective layer 50. The LED die 30 is mounted on the supporting portion 10 and electrically connected with the electrode structure 20 via two metal wires 31 (FIG. 2). The encapsulation 40 is filled between the supporting portion 10 and the electrode structure 20, and covers the LED die 30.

The supporting portion 10 can be made of a material with excellent thermal conductivity and electrical insulation, such as PPA (polyphosphoricacid) or ceramic. In this embodiment, the supporting portion 10 is configured in a center of the LED package 100, like an island. The supporting portion 10 is truncated cone-shaped. The supporting portion 10 includes a top surface 11, a bottom surface 12 opposite to the top surface 11, and a side wall 13 interconnecting the top surface 11 and the bottom surface 12. The top surface 11 and the bottom surface 12 are flat. The top surface 11 is used for supporting the LED die 30. The side wall 13 extends aslant from the top surface 11 to the bottom surface 12, thereby an area of the top surface 11 being smaller than that of the bottom surface 12. In addition to the shape of truncated cone, the supporting portion 10 can be truncated pyramid-shaped or have other desired shapes according to actual requirements.

Referring to FIG. 2, the electrode structure 20 includes a first electrode 21 and a second electrode 22 spaced from each other. The first and second electrodes 21, 22 cooperatively surround the supporting portion 10 and the LED die 30. In this embodiment, each of the first and second electrodes 21, 22 has an L-shaped top view. The first and second electrodes 21, 22 is located adjacent to each other and cooperatively form a substantially rectangular profile. Due to that the second electrode 22 has a similar structure to the first electrode 21, only the first electrode 21 is described below as representation. The first electrode 21 includes a first surface 211, a second surface 212 away from the first surface 211, an inner wall 213 and an outer wall 214 both interconnecting the first surface 211 and second surface 212. The inner wall 213 includes a first oblique plane 2131, a horizontal plane 2132, a second oblique plane 2133 in sequence from the second surface 212 to the first surface 211. The first surface 211 is higher than the top surface 11 of the supporting portion 10. The second surface 212 is coplanar with the bottom surface 12 of the supporting portion 10. In other words, a height of the electrode structure 20 is greater than that of the supporting portion 10. The second oblique plane 2133 extends aslant from the first surface 211 towards the LED die 30. The horizontal plane 2132 extends horizontally from a bottom end of the second oblique plane 2133 towards the LED die 30. The first oblique plane 2131 extends aslant from an inner end of the horizontal plane 2132 to the second surface 212 along a direction away from the LED die 30. In other words, the first oblique plane 2131 and the second oblique plane 2133 are respectively connected to two opposite ends of the horizontal plane 2132, and respectively extend from the horizontal plane 2132 along a direction away from the LED die 30. An inclined direction of the first oblique plane 2131 is opposite to that of the second oblique plane 2133, in respect to the top-to-bottom direction of the LED package 100. The horizontal plane 2132 is parallel to the first surface 211 and the second surface 212. The inner walls 213 of the first electrode 21 and the second electrode 22 surrounds the LED die 30 together. A filling area 23 is defined among the inner walls 213, the LED die 30 and the supporting portion 10 accordant for the encapsulation 40. The outer wall 214 is positioned at an outer surface of the LED package 100. The electrode structure 20 are made of metal with good electrical conductivity, such as gold, silver, copper, platinum, aluminum, nickel, tin, magnesium or alloy thereof. The first oblique plane 2131 and the second oblique plane 2133 can be coated with silver to further improve reflection capability thereof.

The LED die 30 is mounted on the top surface 11 of the supporting potion 10, and electrically connected to the horizontal planes 2132 of the first electrode 21 and the second electrode 22 by the two metal wires 31, respectively. A highest apex portion of the metal wire 31 is lower than the first surfaces 211 of the first electrode 21 and the second electrode 22. There can be one or more LED dies 30 mounted in the LED package 100 according to actual requirements. In this embodiment, there is one LED die 30.

The encapsulation 40 is made of silicone or epoxy resin. The encapsulation 40 is filled in the filling area 23 surrounded by the electrode structure 20, and covers the LED die 30 and the metal wires 31. The encapsulation 40 includes a first outer surface 41 and a second outer surface 42 opposite to the first outer surface 41. The first outer surface 41 of the encapsulation 40 is coplanar with the first surface 211 of the electrode structure 20 where the reflective layer 50 covers, and faces an outputting surface 32 of the LED die 30. The second outer surface 42 of the encapsulation 40 is coplanar with the second surfaces 212 of the electrodes 20 and the bottom surface 12 of the supporting portion 10, and acts as an outputting surface 42 of the LED package 100. The first oblique plane 2131 of the electrode structure 20 extends aslant from the outputting surface 32 of the LED die 30 to the outputting surface 42 of the LED package 100 away from the LED die 30. The reflective layer 50 covers the first outer surface 41 of the encapsulation 40 and faces the outputting surface 32 of the LED die 30. The reflective layer 50 includes a reflective surface 51 located on the first outer surface 41 of the encapsulation 40. Light emitted from the LED die 30 travels to the reflective layer 50 to be reflected by the reflective surface 51 of the reflective layer 50. The second oblique plane 2133 of the electrode structure 20 extends slant from the outputting surface 32 of the LED die 30 to the reflective surface 51 of the reflective layer 50 along the direction away from the LED die 30, such that a size of reflective surface 51 is increased for reflecting much more light. Similarly, the first oblique plane 2131 of the electrode structure 20 extends slant from the outputting surface 32 of the LED die 30 to the outputting surface 42 of the LED package 100 along the direction away from the LED die 30, such that a size of the outputting surface 42 is increased for outputting more light.

In the present disclosure, the reflective layer 50 covers the first outer surface 41 of the encapsulation 40 and faces the outputting surface 32 of the LED die 30. The first oblique plane 2131 and the second oblique plane 2133 are formed at the inner walls 213 of the electrode structure 20. Light emitted from the LED die 30 directly strikes on the reflective layer 50 and can be reflected by the reflective layer 50. One part of the light striking on the reflective layer 50 can be reflected by the reflective layer 50 and then travels out of the LED package 100 via the outputting surface 42. Another part of the light striking on the reflective layer 50 can be reflected by the reflective layer 50 and strikes to the second oblique plane 2133, and then travels to the side wall 13 of the supporting portion 10, the first oblique plane 2131, and finally travels out of the LED package 100 via the outputting surface 42.

The first oblique plane 2131 and the second oblique plane 2133 can increase the sizes of the reflective surface 51 and the outputting surface 42. Inclined angles of the second oblique plane 2133 and the side wall 13 of the supporting portion 10 can limit a light outputting direction. As such, the light emitted from the LED die 30 is deflected towards the outputting surface 42, thereby increasing a light output angle thereof and forming a larger light field. An angle between the first oblique plane 2131 and the outputting surface 42 of the LED package 100 and an angle between the second oblique plane 2133 and the first outer surface 41 of the LED package 100 are both in a range of 50 degrees to 80 degrees.

Figure 3:
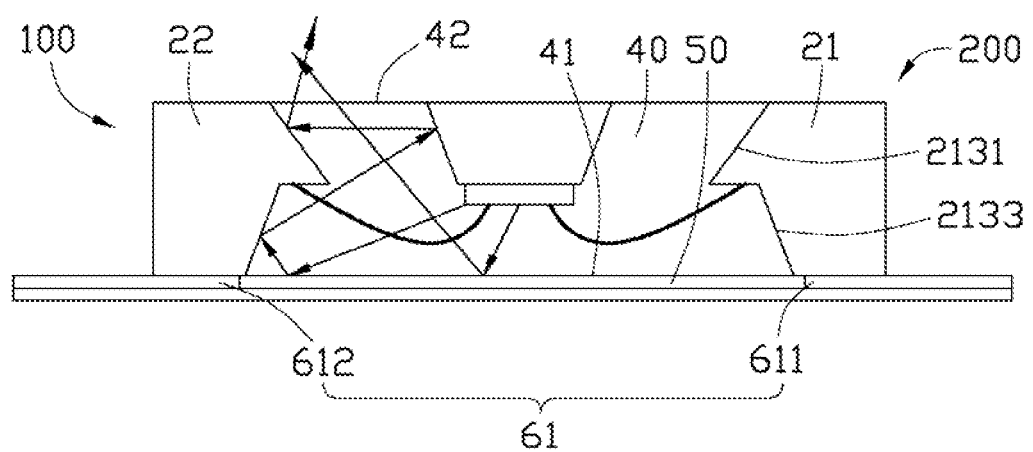
FIG. 3 is a schematic, cross-sectional view of an LED emitting device with the LED package in accordance with an embodiment of the present disclosure.

Referring to FIG. 3, a light emitting device 200 with the LED package 100 in accordance with one embodiment of the present disclosure is provided. The light emitting device 200 includes a substrate 60 and the LED package 100.

The substrate 60 is substantially plate-shaped. The substrate 60 can be made of a material with excellent thermal conductivity and electrical insulation, such as PPA (polyphosphoricacid) or ceramic. A circuit structure 61 is formed on the substrate 60. The circuit structure 61 includes a first electrode area 611 corresponding to the first electrode 21 of the LED package 100 and a second electrode area 612 corresponding to the second electrode 22 of the LED package 100. The first and second electrode areas 611, 612 are spaced from each other, and a distance between the first and second electrode areas 611, 612 is equal to or greater than a size of the reflective surface 51 of the LED package 100. The LED package 100 is fixed on the substrate 60, with the first and second electrodes 21, 22 respectively abutting the first and second electrode areas 611, 612. The reflective layer 50 of the LED package 100 is located on the substrate 60 at a position between the first and second electrode areas 611, 612. The outputting surface 42 of the LED package 100 is located away from the substrate 60. Alternatively, a reflective material can be directly pre-coated on the substrate 100 at the position between the first electrode area 611 and the second electrode area 612 for acting as the reflective layer 50 of the LED package 100.

In the present disclosure, the light emitted from the LED die 30 directly strikes the reflective layer 50 of the LED package 100 and can be reflected back by the reflective layer 50. The light reflected by the reflective layer 50 travels through the encapsulation 40 and is further reflected by the second oblique plane 2133 and the first oblique plane 2131. Finally, the light travels out, via the outputting surface 42, of the LED package 100. The first oblique plane 2131 and the second oblique plane 2133 can increase the sizes of the reflective layer 50 and the outputting surface 42 to improve a luminous efficiency and form a larger light field.

Figure 4:
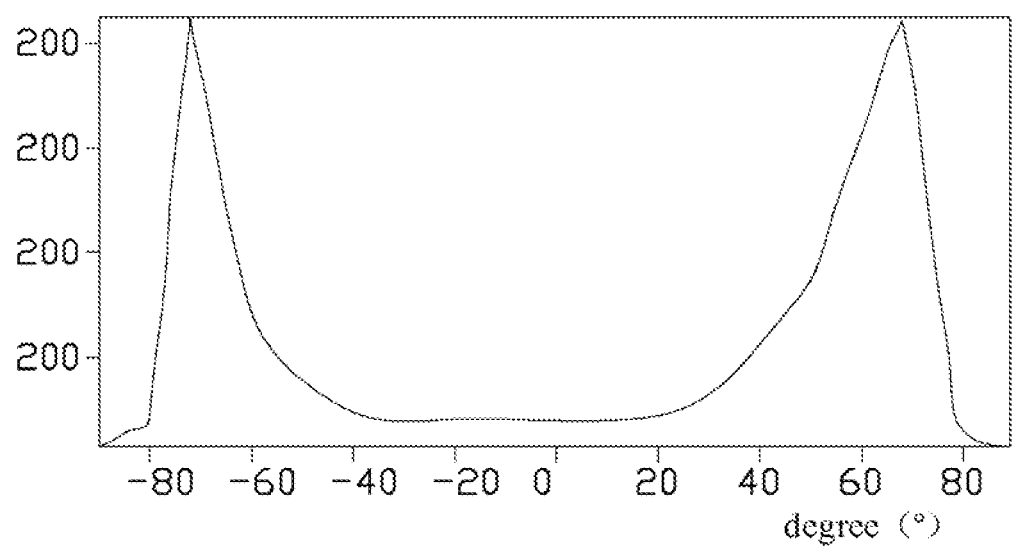
FIG. 4 is a coordinate graph showing a light intensity distribution in a two dimensional plane.

Referring to FIG. 4, an intensity of light generated by the light emitting device 200 of the present disclosure can have a batwing distribution. That is, the light in an angle of −80 degrees to −60 degrees and an angle of 40 degrees to 80 degrees have an intensity stronger than that in an angle between −60 degrees and 40 degrees. Accordingly, the light emitting device 200 can have a wider range of illumination.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:
1. An LED package comprising:
  an electrode structure comprising a first electrode and a second electrode insulated from each other, the first electrode and the second electrode each comprising an inner wall, the inner wall comprising a first oblique plane;
  an LED die surrounded by and electrically connected to the first electrode and the second electrode, the LED die comprising an outputting surface; and
  an encapsulation filled between the first electrode ant the second electrode and covering the LED die, the encapsulation comprising a first outer surface and a second outer surface opposite to the first outer surface, a reflective layer covering the first outer surface of the encapsulation and facing the outputting surface of the LED die, the second outer surface of the encapsulation acting as an outputting surface of the LED package, the first oblique plane of the electrode structure extending aslant from the outputting surface of the LED die towards the outputting surface of the LED package along a direction away from the LED die.

2. The LED package of claim 1, wherein an angle between the first oblique plane and the outputting surface of the LED package is in a range of 50 degrees to 80 degrees.

3. The LED package of claim 1, wherein the inner wall further comprises a second oblique plane extending aslant from the reflective layer towards the LED die.

4. The LED package of claim 2, wherein an angle between the second oblique plane and the first outer surface of the LED package is in a range of 50 degrees to 80 degrees.

5. The LED package of claim 2, wherein the inner wall further comprises a horizontal plane, wherein the horizontal plane is positioned between and connects the first oblique plane and the second oblique plane, and the LED die is electrically connected to the horizontal plane.

6. The LED package of claim 5, wherein the first oblique plane and the second oblique plane are respectively connected to two opposite ends of the horizontal plane, the first oblique plane and the second oblique plane extend from the horizontal plane along the direction away from the LED die, and an oblique direction of the first oblique plane is opposite to that of the second oblique plane.

7. The LED package of claim 1, further comprising a supporting portion surrounded by the electrode structure and in a center of the LED package, wherein the LED die is mounted on the supporting portion.

8. The LED package of claim 7, wherein the supporting portion comprises a top surface, a bottom surface and a side wall interconnecting the top surface and the bottom surface, the bottom surface of the supporting portion is coplanar with the outputting surface of the LED package, and the LED die is mounted on the top surface of the supporting portion.

9. The LED package of claim 8, wherein the side wall extends aslant from the top surface to the bottom surface of the supporting portion along the direction away from the LED die.

10. The LED package of claim 8, wherein a height of the electrode is greater than that of the supporting portion.

11. The LED package of claim 8, wherein an area of the top surface is smaller than that of the bottom surface.

12. A light emitting device comprising:
a substrate with a circuit structure formed thereon, the circuit structure comprising a first electrode area and a second electrode area spaced from each other; and
an LED package fixed on the substrate;
wherein the LED package comprises:
an electrode structure comprising a first electrode and a second electrode insulated from each other, the first electrode and the second electrode each comprising an inner wall, the inner wall comprising a first oblique plane, the first electrode and the second electrode in electrically connection with the first electrode area and the second electrode area of the circuit structure respectively;
an LED die surrounded by and electrically connected to the first electrode and the second electrode, the LED die comprising an outputting surface; and
an encapsulation filled between the first electrode ant the second electrode and covering the LED die, the encapsulation comprising a first outer surface and a second outer surface opposite to the first outer surface, a reflective layer covering the first outer surface of the encapsulation and facing the outputting surface of the LED die, the second outer surface of the encapsulation acting as an outputting surface of the LED package which faces away from the substrate, the first oblique plane of the electrode structure extending aslant from the outputting surface of the LED die towards the outputting surface of the LED package along a direction away from the LED die.

13. The light emitting device of claim 12, wherein the reflective layer of the LED package is located on the substrate at a position between the first electrode area and the second electrode area.

14. The light emitting device of claim 13, wherein a distance between the first electrode area and the second electrode area is equal to or greater than a size of the reflective layer of the LED package.

15. The light emitting device of claim 12, wherein a reflective material is directly pre-coated on the substrate at the position between the first electrode area and the second electrode area for acting as and replacing the reflective layer of the LED package.

* * * * *